(12) United States Patent
Do

(10) Patent No.: US 8,183,912 B2
(45) Date of Patent: May 22, 2012

(54) INTERNAL VOLTAGE SUPPLYING DEVICE

(75) Inventor: Chang-Ho Do, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/875,018

(22) Filed: Sep. 2, 2010

(65) Prior Publication Data

US 2010/0320988 A1 Dec. 23, 2010

Related U.S. Application Data

(62) Division of application No. 11/528,968, filed on Sep. 27, 2006, now abandoned.

(30) Foreign Application Priority Data

Sep. 29, 2005 (KR) .............................. 2005-0090961
May 31, 2006 (KR) .............................. 2006-0049119

(51) Int. Cl.
*H03K 3/01* (2006.01)
(52) U.S. Cl. .......................... 327/534; 327/538; 327/540
(58) Field of Classification Search .......... 327/534–543, 327/589
See application file for complete search history.

(56) References Cited

U.S. PATENT DOCUMENTS

| | | | |
|---|---|---|---|
| 6,114,876 A | 9/2000 | Kwong et al. | |
| 6,294,950 B1 | 9/2001 | Lee et al. | |
| 6,342,802 B1 | 1/2002 | Forehand | |
| 6,373,753 B1 | 4/2002 | Proebsting | |
| 6,518,830 B2 | 2/2003 | Gariboldi et al. | |
| 6,614,270 B2 | 9/2003 | Okamoto et al. | |
| 6,853,567 B2 | 2/2005 | Kwon | |
| 6,861,895 B1 | 3/2005 | Liu et al. | |
| 6,876,246 B2 | 4/2005 | Kim | |
| 7,477,097 B2 * | 1/2009 | Choi et al. ..................... | 327/543 |
| 7,772,916 B2 * | 8/2010 | Im ................................. | 327/534 |
| 2004/0208026 A1 | 10/2004 | Kwon | |
| 2004/0239409 A1 | 12/2004 | Jang et al. | |
| 2006/0097804 A1 | 5/2006 | Im et al. | |

FOREIGN PATENT DOCUMENTS

| | | |
|---|---|---|
| JP | 10-337003 | 12/1998 |
| JP | 2003-030985 | 1/2003 |
| JP | 2005-318034 | 11/2005 |
| KR | 2003-0002251 | 1/2003 |
| KR | 2003-0047020 | 6/2003 |
| KR | 2003-0093035 | 12/2003 |
| KR | 10-2007-0002804 | 1/2007 |

* cited by examiner

*Primary Examiner* — Dinh T. Le
(74) *Attorney, Agent, or Firm* — Blakely, Sokoloff, Taylor & Zafman

(57) ABSTRACT

An internal voltage supplying device. A reference voltage generator generates a first feedback voltage having a predetermined voltage ratio with respect to a core voltage. An adjusting mechanism adjusts the voltage ratio, and a voltage generator supplies a high voltage having a level higher than a level of the core voltage by the level of a threshold voltage or higher and maintains the level of the high voltage in accordance with the first feedback voltage.

16 Claims, 6 Drawing Sheets

INTERNAL VOLTAGE SUPPLYING DEVICE

CROSS REFERENCE TO RELATED APPLICATION

The present patent application is a Divisional Application claiming the benefit of non-provisional U.S. patent application Ser. No. 11/528,968, filed Sep. 27, 2006 now abandoned.

FIELD OF THE INVENTION

The present invention relates to semiconductor design technology, and more particularly, to an internal voltage supplying device in a semiconductor memory device, which can improve device reliability.

DESCRIPTION OF RELATED ARTS

Generally, the size of a semiconductor chip has been designed to be scaled down as semiconductor memory devices become highly integrated. Thus, a cell size in the chip has become even smaller, and an operating voltage has also decreased because of the reduced cell size. An internal voltage generating circuit generating an internal voltage has been provided on-chip to supply an operating voltage of an internal circuit of the chip. For reference, other various terms are being used for the internal voltage generating circuit in this field of technology, such as an internal voltage decreasing circuit or a voltage decreasing circuit. The internal voltage generating circuit has been designed to supply a stable level of internal voltage uniformly when generating the operating voltage of the chip. Uses of the internal voltage in a typical semiconductor memory device are described in connection with the following drawings.

FIG. 1 illustrates a circuit diagram of a unit memory cell in a typical semiconductor memory device. The unit memory cell of a typical dynamic random access memory (DRAM) includes a capacitor C1 for storing data, a bit line BL for transferring the data, an N-channel metal-oxide semiconductor (NMOS) transistor NM1 for coupling the capacitor C1 and the bit line BL, and a word line WL for controlling a gate potential of the NMOS transistor NM1.

The NMOS transistor NM1 is coupled to the capacitor C1, which is a storage space for the cell data, and the bit line BL. When the NMOS transistor NM1 transfers a high potential of a logic level 'H', a voltage loss occurs in the amount of a threshold voltage Vt due to characteristics of the NMOS transistor NM1. The high potential of the logic level 'H' can be transferred without the threshold voltage loss, by applying a high voltage raised higher than an internal core voltage VCORE, to the word line WL for turning on the NMOS transistor NM1, even when data of the logic level 'H' are stored in the capacitor C1.

Generation of a high voltage VPP supplied to a word line is described in the following drawing, wherein the high voltage VPP has a level higher than the internal core voltage VCORE by the level of the threshold voltage Vt.

FIG. 2 illustrates a block diagram of a typical internal voltage supplying device. The typical internal voltage supplying device includes: a reference voltage generating unit 10 for generating a high potential-reference voltage VREFP and a core-reference voltage VREFC; a core voltage generating unit 20 for generating an internal core voltage WORE having a level corresponding to the core-reference voltage VREFC by converting an external voltage VDD; and a high voltage generating unit 30 for generating a high voltage VPP having a level corresponding to the high potential-reference voltage VREFP and higher than the internal core voltage VCORE.

The high voltage generating unit 30 includes: a level sensing unit 32 for outputting a level signal PPEN by sent a level of the high voltage VPP with respect to the high potential reference voltage VREFP; an oscillator 34 for generating an oscillation signal OSC oscillating at a predetermined period in response to the level signal PPEN; and a pumping unit 36 for pumping charges during an activation interval of the oscillation signal OSC to output the high voltage VPP.

The typical internal voltage supplying device allows the high voltage VPP and the internal core voltage VCORE to have a level difference higher than the level of the threshold voltage Vt by generating the high potential-reference voltage VREFP and the core-reference voltage VREFC having a predetermined level relationship through the reference voltage generating unit 10.

Processes for generating the high voltage VPP and the internal core voltage VCORE by the internal voltage supplying device are described as follows.

When a DRAM is operated, the high voltage VPP and the internal core voltage VCORE are utilized in corresponding circuit blocks accordingly. Potential levels of the high voltage VPP and the internal core voltage VCORE decrease below a predetermined level as the high voltage VPP and the internal core voltage VCORE are utilized.

The core voltage generating unit 20 generates the internal core voltage VCORE having a predetermined level and the high voltage generating unit 30 generates the high voltage VPP having a predetermined level, respectively.

FIG. 3 illustrates an internal circuit diagram of the level sensing unit 32 in FIG. 2. The level sensing unit 32 includes: dividing unit 32A for dividing the high voltage VPP to output a feedback-high voltage VP_D; a comparator 32B for comparing voltage levels of the feedback-high voltage VP_D and the high potential-reference voltage VREFP; and a buffer 32C for buffering an output signal of the comparator 32B to output the level signal PPEN.

In more detail, the dividing unit 32A couples first and second resistors R1 and R2 in series and outputs the feedback-high voltage VP_D.

The comparator 32B includes a differential amplifier receiving the feedback-high voltage VP_D and the high potential-reference voltage VREFP.

The comparator 32B activates the output signal when a level of the feedback-high voltage VP_D decreases below the high potential-reference voltage VREFP, and the buffer 32C buffers and outputs the output signal. Thus, the level signal PPEN is activated into the logic level 'H'. On the contrary, when the revel of the feedback-high voltage VP_D increases higher than the high potential-reference voltage VREFP, the level signal PPEN is deactivated into a logic level 'L' by the comparator 32B and the buffer 32C.

Meanwhile, when the level signal PPEN is activated, the oscillation signal OSC is activated by the oscillator 34. Thus, the pumping unit 36 pumps charges during the activation of the oscillation signal OSC to increase the level of the high voltage VPP. When the level signal PPEN is deactivated, the oscillator 34 is turned off and the oscillation signal OSC is deactivated. Thus, the pumping unit 36 is also turned off.

The level of the high voltage VPP generated by the processes above can be determined by a mathematical equation below:

$$VPP = ((R1+R2)/R2) * VREFP$$

As is illustrated in the mathematical equation, the level of the high voltage VPP is determined by multiplying a coefficient (R1+R2)/R2, and the high potential-reference voltage VREFP. Thus, the level of the high voltage VPP can be changed into a desired level by adjusting a resistance ratio of the dividing unit 32A or a voltage level of the high potential-reference voltage VREFP.

However, the difference in the levels of the high voltage VPP and the internal core voltage VCORE may fall below the level of the threshold voltage Vt in actual operation. This result is caused by the internal core voltage VCORE not being able to ideally maintain the level predetermined by the core-reference voltage VREFC, but increasing too much above the predetermined level according to various internal operation circumstances during actual operation. When a level of the external voltage VDD is high and the level of the internal core voltage VCORE is high, a large amount of charges are supplied to generate the internal core voltage VCORE. Thus, the level of the internal core voltage VCORE often undesirably increases excessively.

Generally, the high voltage VPP generated by the typical method is determined by the high potential-reference voltage VREFP, regardless of the actual level of the internal core voltage VCORE. That is, the changed levels of the high voltage VPP and the internal core voltage VCORE are unrelated, and consequently, losses may occur while transferring the logic level 'H' through an NMOS transistor of the cell when the voltage level of the high voltage VPP is higher than the voltage level of the internal core voltage VCORE by less than the level of the threshold voltage Vt. When the high voltage VPP is supplied to a gate of the NMOS transistor of the cell and the logic level 'H' data of the internal core voltage VCORE level is supplied to a terminal of the NMOS transistor, the NMOS transistor cannot properly transfer the logic level 'H' of the internal core voltage VCORE level because the high voltage VPP is not higher than the voltage level of the internal core voltage VCORE by the level of the threshold voltage Vt.

An internal voltage supplying device having a mirror type comparator for directly comparing the internal core voltage VCORE and the high voltage VPP may be equipped to reduce some of the deterioration in the VPP and VCORE levels. However, the internal voltage supplying device having the mirror type comparator does not include means for adjusting the frequent fluctuations of the internal core voltage. The fluctuations of the actual internal core voltage may cause extreme fluctuations in the level of the high voltage VPP. Accordingly, operations of a DRAM including such internal voltage supplying device having the mirror type comparator may become unstable due to the abrupt level fluctuations f the high voltage VPP.

SUMMARY OF THE INVENTION

An embodiment of the invention is an internal voltage supplying device in a semiconductor memory device which can improve device reliability.

In accordance with an aspect of the present invention, there is provided an internal voltage supplying device, including: a level sensing means for sensing a level of a high voltage with respect to a core voltage; an oscillation signal generating means for generating an oscillation signal controlled by the level sensing means; and a pumping means for pumping charges during an activation interval of the oscillation signal to generate the high voltage having a level higher than a level of the core voltage, by a level of a threshold voltage or higher.

In accordance with another aspect of the present invention, there is provided an internal voltage supplying device, including: a reference voltage generating means for generating a first feedback voltage having a predetermined voltage ratio with respect to a core voltage; an adjusting means for adjusting the voltage ratio; and a voltage generating means for supplying a high voltage having a level higher than a level of the core voltage by the level of a threshold voltage or higher and for maintaining said level of the high voltage in accordance with the first feedback voltage.

In accordance with still another aspect of the present invention, there is provided a method for operating an internal voltage supplying device, including: generating a first feedback voltage having a predetermined voltage ratio with respect to a core voltage; generating a second feedback voltage having a predetermined voltage ratio with respect to a high voltage; and generating the high voltage having a level raised higher than a level of the core voltage by the level of a threshold voltage or higher, while maintaining a level of the second feedback voltage to correspond to the first feedback voltage, wherein the core voltage is used for storing data of a logic level in a cell, and the high voltage is used for activating the cell to allow the data to be transferred.

In accordance with still another aspect of the present invention, there is provided a semiconductor memory device, including: a high voltage generating circuit to generate a high voltage having a voltage level higher than a power supply voltage by a first voltage level; a core voltage generating circuit to generate a core voltage having a voltage level lower than the power supply voltage by a second voltage level; a level sensing unit to sense the voltage level of the core voltage to adjust the voltage level of the high voltage; and a data transferring metal-oxide semiconductor (MOS) transistor to transfer a data signal having the voltage level of the core voltage, the data transferring MOS transistor to turn on in response to the high voltage.

BRIEF DESCRIPTION OF THE DRAWINGS

The above and other features of the present invention will become better understood with respect to the following description of the exemplary embodiments given in conjunction with the accompanying drawings, in which.

DETAILED DESCRIPTION OF THE INVENTION

An internal voltage supplying device in accordance with exemplary embodiments of the present invention will be described in detail with reference to the accompanying drawings.

Figure 1:
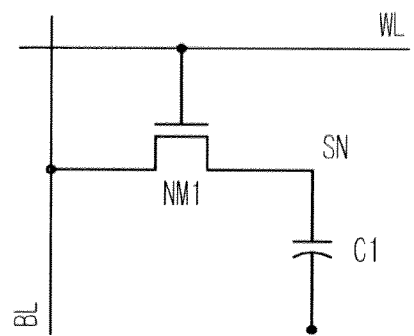
FIG. 1 illustrates a circuit diagram of a unit memory cell in a typical semiconductor memory device.
Figure 2:
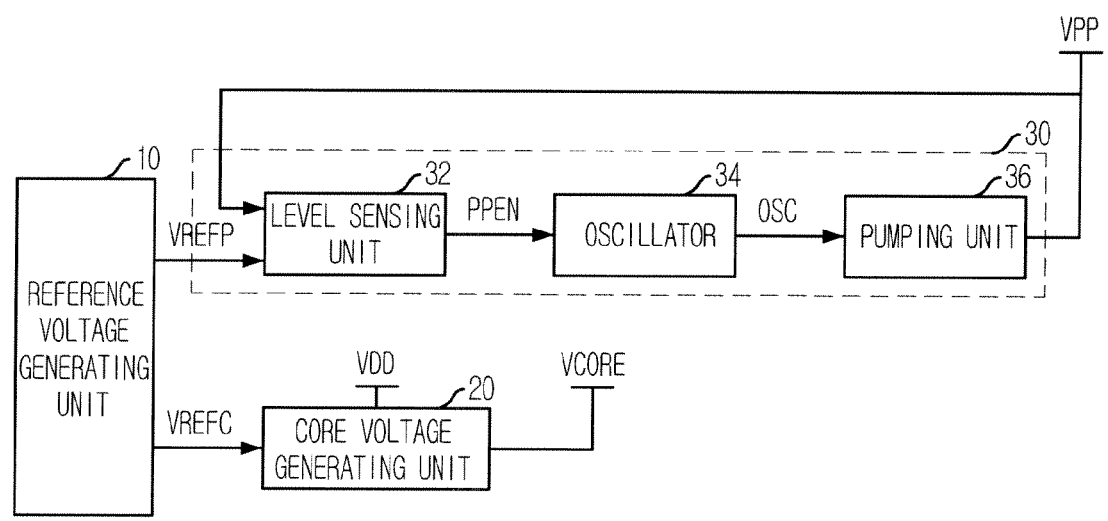
FIG. 2 illustrates a block diagram of a typical internal voltage supplying device in a semiconductor memory device.
Figure 3:
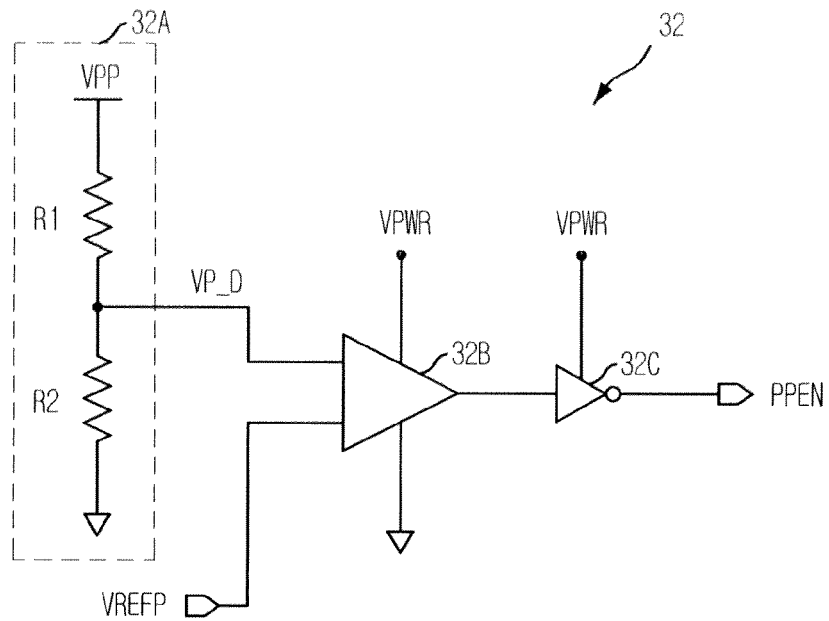
FIG. 3 illustrates an internal circuit diagram of a sensing unit shown in FIG. 2.
Figure 4:
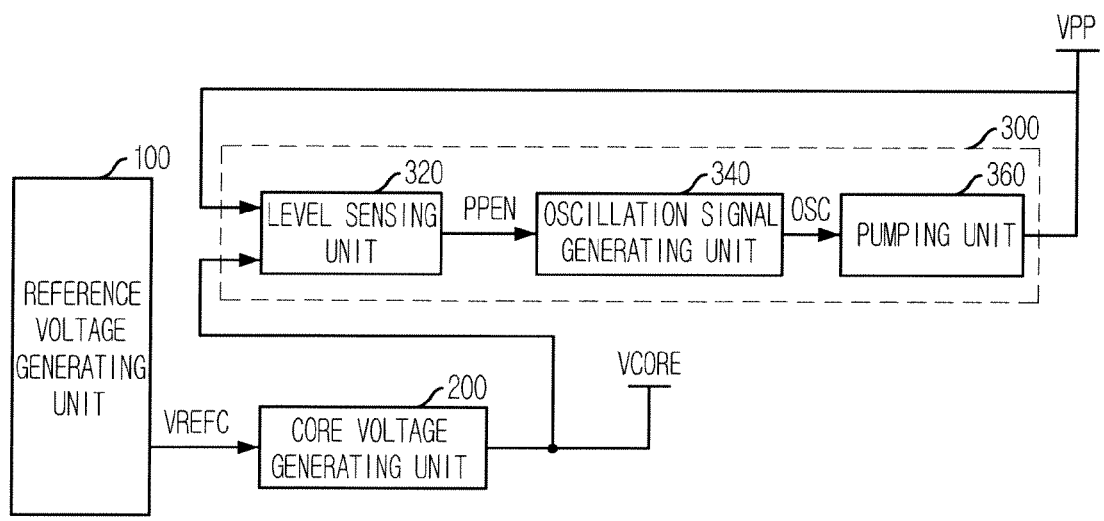
FIG. 4 illustrates a block diagram of an internal voltage supplying device in accordance with a first embodiment of this invention.

FIG. 4 illustrates a block diagram of an internal voltage supplying device in accordance with a first embodiment of this invention. The internal voltage supplying device in accordance with the first embodiment includes: a reference voltage generating unit 100 generating a core-reference voltage VREFC; a core voltage generating unit 200 generating an internal core voltage VCORE having a level corresponding to the core-reference voltage VREFC by converting an external voltage VDD; and a high voltage generating unit 300 generating a high voltage VPP higher than the internal core voltage VCORE by a predetermined level.

The high voltage generating unit 300 includes: a level sensing unit 320 outputting a level signal PPEN by sensing a level of the high voltage VPP with respect to the internal core voltage VCORE; an oscillation signal generating unit 340 generating an oscillation signal OSC oscillating in response to the level signal PPEN; and a pumping unit 360 pumping charges to a terminal of the high voltage VPP during an activation interval of the oscillation signal OSC.

The Internal voltage supplying device consistent with the first embodiment directly receives the internal core voltage VCORE in the high voltage generating unit 300, and generates the high voltage VPP with the internal core voltage VCORE as a reference. Thus, even if a level of the internal core voltage VCORE increases or decreases in actual operation, the high voltage VPP generated with the internal core voltage VCORE as the reference can maintain a voltage level difference, i.e., a threshold voltage, higher than the internal core voltage VCORE at all times. Details of internal circuits of each block are described hereinafter.

Figure 5:
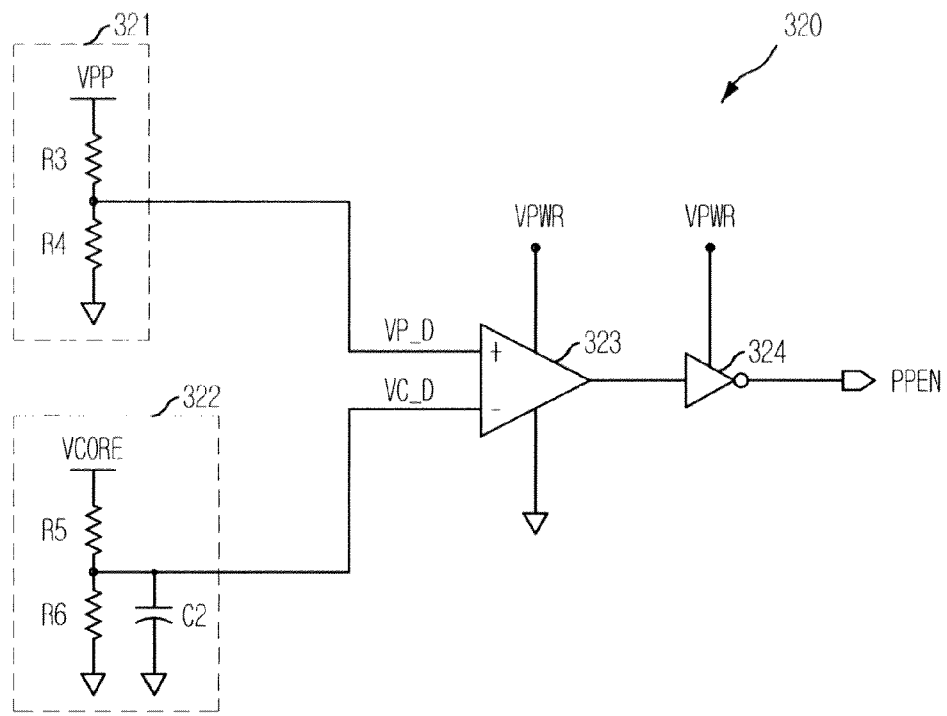
FIG. 5 illustrates an internal circuit diagram of a level sensing unit shown in FIG. 4.

FIG. 5 illustrates an internal circuit diagram of the level sensing unit 320 shown in FIG. 4. The level sensing unit 320 includes: a high voltage feedback unit 321 dividing the high voltage VPP to output as a feedback-high voltage VP_D; a core voltage dividing unit 322 dividing the internal core voltage VCORE to output as a reference voltage VC_D; a comparator 323 comparing levels between the reference voltage VC_D and the feedback-high voltage VP_D; and buffer 324 buffering an output signal of the comparator 323 to output the level signal PPEN.

The high voltage feedback unit 321 includes first and second resistors R3 and R4 coupled between the high voltage VPP and ground voltage VSS in series, and outputs the feedback-high voltage VP_D.

The core voltage dividing unit 322 includes third and fourth resistors R5 and R6 coupled between the terminal of the internal core voltage VCORE and the terminal of the ground voltage VSS in series and a capacitor C2 coupled to a connect node of the third and fourth resistors R5 and R6, and outputs the reference voltage VC_D.

The comparator 323 includes a differential amplifier having the reference voltage VC_D and the feedback-high voltage VP_D as differential inputs.

The comparator 320 receives the feedback-high voltage VP_D dividing the high voltage VPP as an input of the differential amplifier and receives the reference voltage VC_D generated by dividing the internal core voltage VCORE as another input of the differential amplifier. Thus, when the level of the internal core voltage VCORE increases higher than a predetermined level corresponding to the core-reference voltage VREFC in an actual DRAM operation, the level of the reference voltage VC_D increases. Consequently, the level of the high voltage VPP generated using the reference voltage VC_D as a reference identically increases as much as the increased level of the reference voltage VC_D. The level difference between the high voltage VPP and the internal core voltage VCORE is uniformly maintained. That is, the high voltage VPP maintains the level higher than the internal core voltage VCORE by the level of the threshold voltage at all times.

The core voltage dividing unit 322 includes the capacitor C2 at an output node. The core voltage dividing unit 322 can stably maintain the level of the reference voltage VC_D through the capacitor C2 when the level of the internal core voltage VCORE fluctuates momentarily. That is, excessive driving of the level sensing unit 320 can be prevented by stabilizing the level of the reference voltage VC_D at times of momentary fluctuations of the internal core voltage VCORE.

For reference, the core voltage dividing unit 322 may include a plurality of resistors coupled in series and a plurality of capacitors, each capacitor coupled to each of the connect nodes of the resistors. The resistors may embody a passive device or an active device such as a transistor.

Driving methods of the internal voltage supplying device illustrated in FIGS. 4 and 5 are described below. Especially, the process of generating the high voltage VPP is described in more detail.

The reference voltage VC_D and the feedback-high voltage VP_D, which are divided, are outputted by the core voltage dividing unit 322 and the high voltage feedback unit 321. The comparator 323 and the buffer 324 activate the level signal PPEN when the level of the feedback-high voltage VP_D decreases below the reference voltage VC_D. The oscillation signal generating unit 340 generates the oscillation signal OSC oscillating during the activation of the level signal PPEN. The charge pumping unit 360 pumps charges to generate the high voltage VPP in response to the oscillation signal OSC. This process is repeatedly performed until the high voltage VPP obtains a level corresponding to the reference voltage VC_D.

Because the internal voltage supplying device consistent with the first embodiment receives the internal core voltage VCORE in actual operation and generates the high voltage VPP using the internal core voltage VCORE as a reference, the high voltage VPP can maintain a level higher than the internal core voltage VCORE by a certain level at all times, even when the level of the internal core voltage VCORE fluctuates due to various conditions. Thus, when transferring data having the level of the internal core voltage VCORE in the cell, the voltage loss for the same level as the threshold voltage may not occur. Thus, device reliability improves.

The level of the high voltage VPP generated by the internal voltage supplying device illustrated in FIGS. 4 and 5 can be determined by a first mathematical equation below:

$$VPP = ((R3+R4)/R4) * (R6/(R5+R6)) * VCORE$$

As illustrated in the first mathematical equation above, the high voltage VPP can be determined by multiplying resistance ratios (R3+R4)/R4 and R6/(R5+R6) of the high voltage feedback unit 321 and the core voltage dividing unit 322, respectively, and the internal core voltage VCORE. Thus, even when the level of the internal core voltage VCORE fluctuates due to actual operations of the DRAM, the level of the high voltage VPP is also determined by the changed level of the internal core voltage VCORE as a reference. That is the high voltage VPP is determined by the level of the internal core voltage VCORE.

Meanwhile, the level of the high voltage VPP can be adjusted through a test mode and a fuse option as described in the following.

Figure 6:
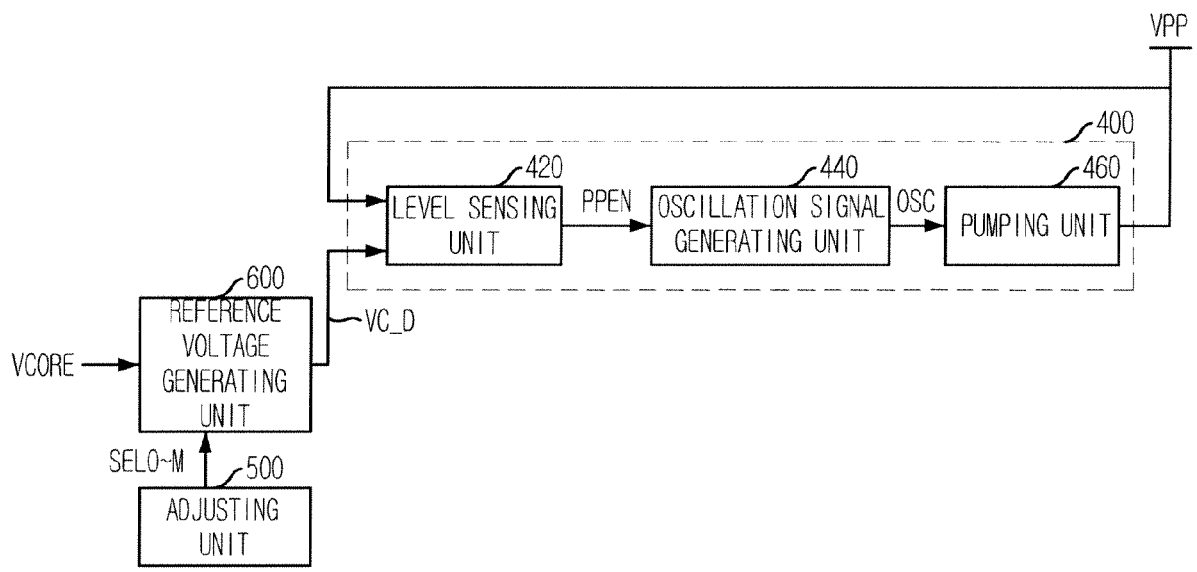
FIG. 6 illustrates a block diagram of an internal voltage supplying device in accordance with a second embodiment of this invention.

FIG. 6 illustrates a block diagram of an internal voltage supplying device in accordance with a second embodiment of this invention. The internal voltage supplying device consistent with the second embodiment includes: a reference voltage generating unit 600 generating a reference voltage VC_D having a predetermined voltage ratio with respect to an internal core voltage VCORE; an adjusting unit 500 adjusting the predetermined voltage ratio in the reference voltage generating unit 600; and a high voltage generating unit 400 generating a high voltage VPP raised higher than the internal core voltage VCORE while maintaining a level corresponding to the reference voltage VC_D.

The high voltage generating unit 400 includes: a level sensing unit 420 outputting a level signal PPEN by sensing a level of the high voltage VPP with respect to the reference voltage VC_D; an oscillation signal generating unit 440 generating an oscillation signal OSC oscillating for a predetermined period in response to the level signal PPEN; and a pumping unit 460 pumping charges during an activation interval of the oscillation signal OSC to generate as the high voltage VPP.

The internal voltage supplying device consistent with the second embodiment further includes the adjusting unit 500 to divide the internal core voltage VCORE in various levels and select one of the levels through the adjusting unit 500. An adequate level of the high voltage VPP can be selected through the level adjustment of the reference voltage VC_D according to operational circumstances.

Figure 7:
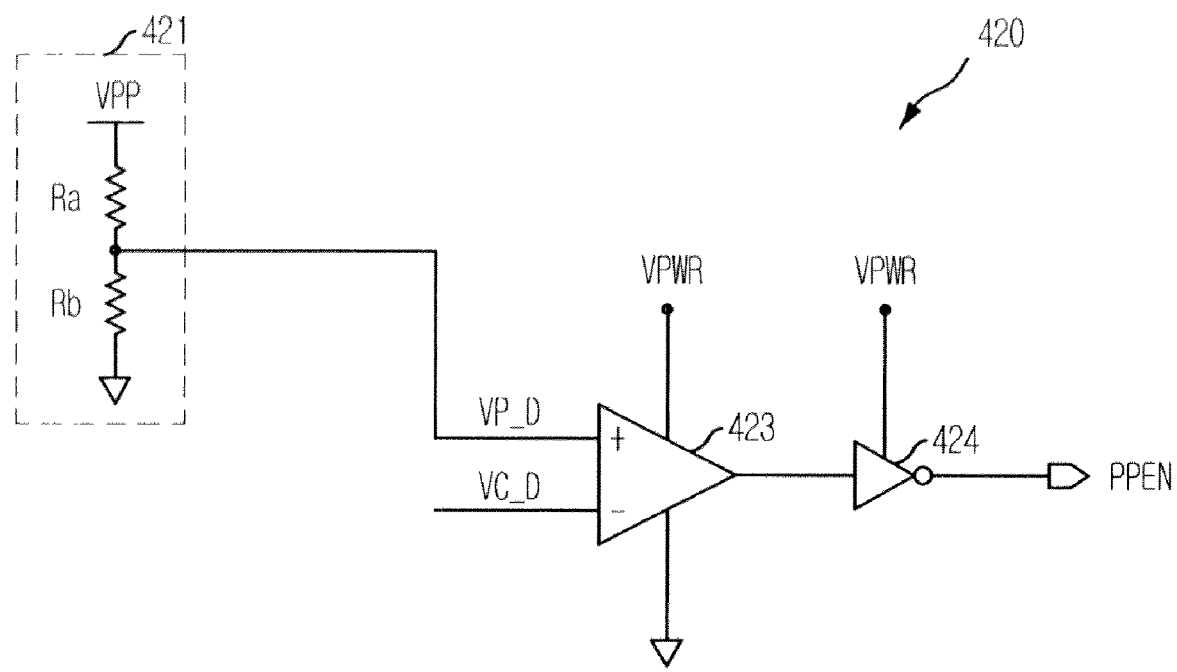
FIG. 7 illustrates an internal circuit diagram of a level sensing unit shown in FIG. 6.

FIG. 7 illustrates an internal circuit diagram of the level sensing unit 420 shown in FIG. 6. The level sensing unit 420 has a similar circuit structure as the level sensing unit 320 illustrated in FIG. 5. However, the level sensing unit 420 does not include a unit corresponding to the core voltage dividing unit 322 in FIG. 5. Thus, the reference voltage VC_D (not the internal core voltage VCORE) is directly supplied into the level sensing unit 423 from the reference voltage generating unit 600. Since structures of the blocks for the level sensing units 420 and 320 are substantially the same, details of the level sensing unit 420 are omitted herein.

Figure 8:
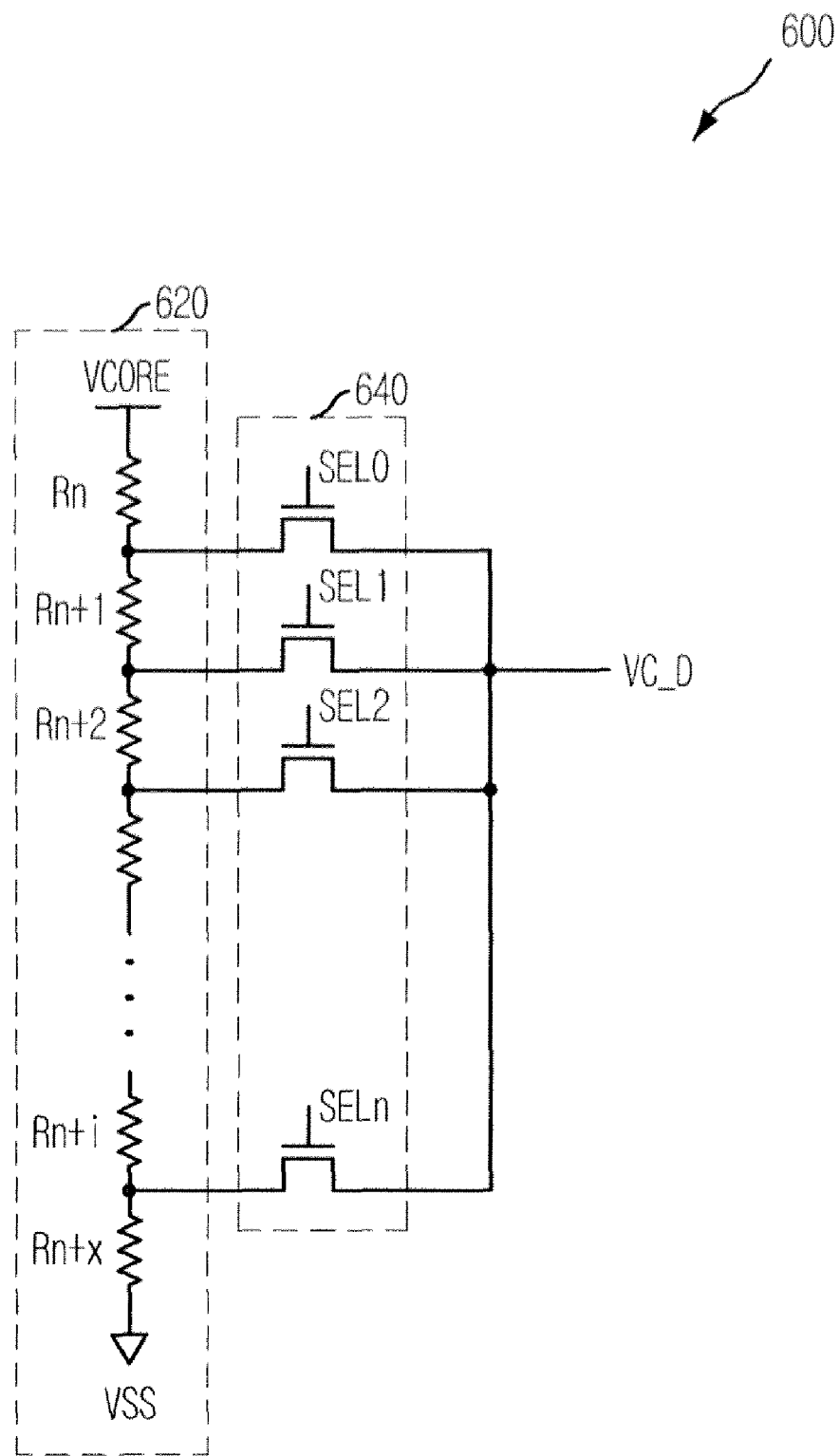
FIG. 8 illustrates an internal circuit diagram of a reference voltage generating unit shown in FIG. 6.

FIG. 8 illustrates an internal circuit diagram of the reference voltage generating unit 600 shown in FIG. 6. The reference voltage generating unit 600 includes: a dividing unit 620 dividing the internal core voltage VCORE through a plurality of resistors $R_n$ to $R_{n+x}$ to output a plurality of dividing voltages; and a selection unit 640 outputting a dividing voltage corresponding to a plurality of selection signals SEL0 to SELn as the reference voltage VC_D. The selection unit 640 includes a plurality of switches for transferring the reference voltage VC_D in response to the selection signals SEL0 to SELn.

Although not illustrated in FIG. 8, excessive driving of the high voltage generating unit 400 can be prevented by coupling a plurality of capacitors to each of connect nodes of the resistors $R_n$ to $R_{n+x}$ in the dividing unit 620 or coupling a capacitor to an output node of the selection unit 640 at times of momentary fluctuations of he internal core voltage VCORE.

Figure 9:
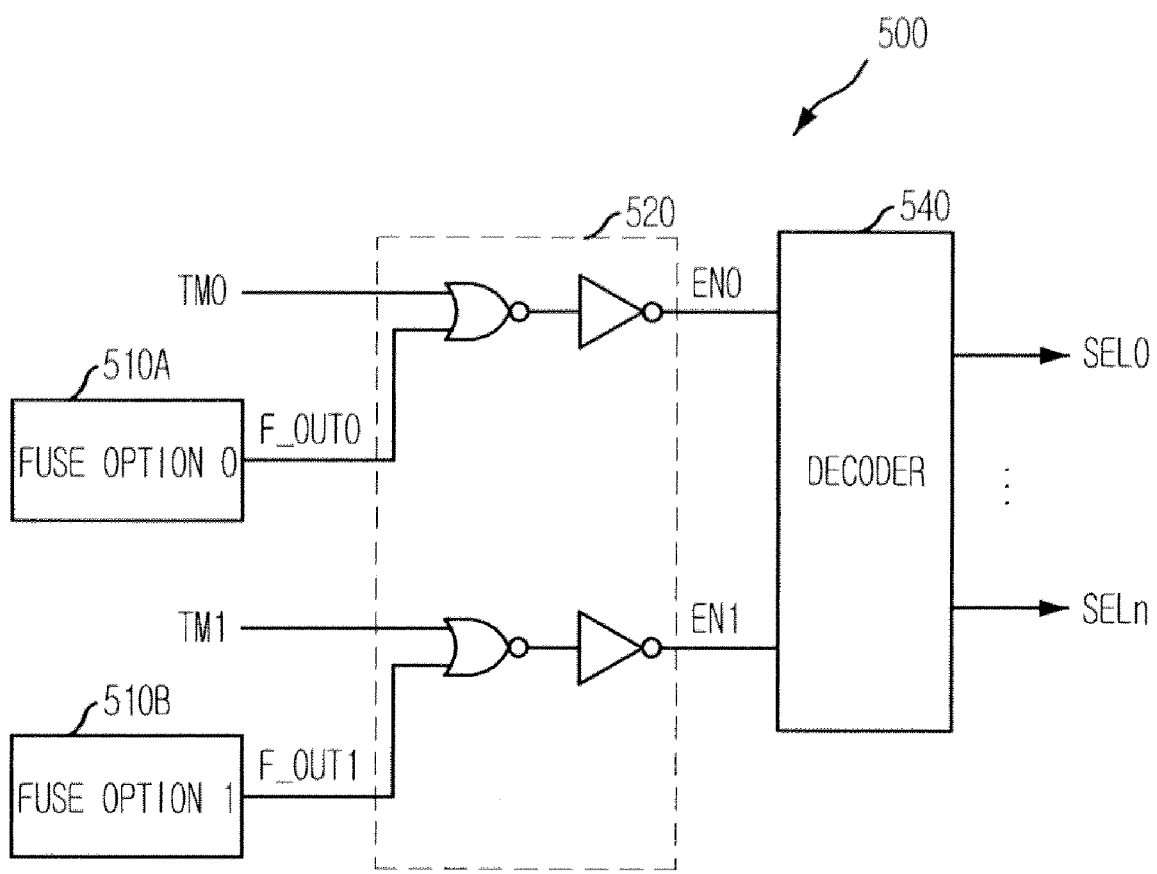
FIG. 9 illustrates an internal circuit diagram of an adjusting unit shown in FIG. 6.

FIG. 9 illustrates an internal circuit diagram of the adjusting unit 500 shown in FIG. 6. The adjusting unit 500 includes: a setup unit 520 receiving test mode signals TM0 and TM1 and output signals F_OUT0 and F_OUT1 of fuse option units 510A and 510B to output setup signals EN0 and EN1; and a decoder 540 activating one of the selection signals by decoding the setup signals EN0 and EN1.

The setup unit 520 includes a plurality of NOR gates, each NOR gate having a test mode signal and an output signal of the fuse option units as inputs, and inverters for inverting an output signal of each NOR gate to output as a corresponding setup signal.

Although there are two test mode signals and two fuse options units illustrated in FIG. 9, a plurality of test mode signals and fuse option units can be supplied according to the number of dividing voltages generated by the dividing unit 620.

The adjusting unit 500 may selectively receive the test mode signals TM0 and TM1 or include the fuse option units. In this case, the selection signals SEL0 to SELn can be generated by directly supplying the test mode signals TM0 and TM1 or the output signals F_OUT0 and F_OUT1 of the fuse option units 510A and 510B to the decoder 540 without using the setup unit 520.

Operations of the internal voltage supplying device consistent with the second embodiment illustrated in FIGS. 6 to 9 are described in more detail.

The dividing unit 620 divides the internal core voltage VCORE in various voltage ratios to generate a plurality of dividing voltages. The setup unit 520 activates the setup signal EN0 and EN1 in response to the test mode signals TM0 and TM1 supplied in the test mode. The decoder 540 decodes the setup signals EN0 and EN1 and activates a corresponding selection signal of the selection signals SEL0 to SELn. The selection unit 640 outputs the dividing voltage corresponding to the activated selection signal as the reference voltage VC_D.

The high voltage generating unit 400 pumps charges to generate the high voltage VPP that maintains the level corresponding to the reference voltage VC_D.

The level of the high voltage VPP can be adjusted by adjusting the level of the reference voltage VC_D through various combinations of the test mode signals TM0 and TM1 in the test mode.

Meanwhile, after finding the adequate level of the high voltage VPP through the test mode by testing the level of the high voltage, the level of the high voltage VPP according to the test result is determined through cuttings of the fuse options. In more detail, when fuses of the fuse option units are selectively blowed, the corresponding output signals F_OUT0 and F_OUT1 of the fuse option units are activated into a logic level 'H'. Thus, the setup unit 520 and the decoder 540 activate the corresponding selection signal. The reference voltage generating unit 600 outputs the dividing voltage corresponding to the corresponding selection signal as the reference voltage VC_D. Thus, the high voltage generating unit 400 generates the high voltage VPP having the level corresponding to the adjusted reference voltage VC_D.

The level of the outputted high voltage VPP is determined by a second mathematical equation below. For reference, it is hypothesized that the feedback-high voltage VP_D has a ratio of R2/(R1+R2) to the high voltage VPP, and the reference voltage VC_D outputs the dividing voltage corresponding to an activated selection signal SEL1.

$$VPP=((Ra+Rb)/Rb)*((R_{n+2}+R_{n+3}+\ldots+R_{n+x})/(R_n+R_{n+1}+R_{n+2}+\ldots R_{n+x}))*VCORE$$

As it is illustrated in the second mathematical equation, the internal voltage supplying device consistent with the second embodiment may adjust the level of the high voltage VPP through the test mode or the fuse option units.

Consistent with the second. embodiment, the internal voltage supplying device generates the high voltage by receiving the internal core voltage during operations of the DRAM, and thus, supplies the high voltage related to the internal core voltage all times. Furthermore, by further including the capacitor in the reference voltage generating unit 600, the excessive driving of the high voltage generating unit due to sudden fluctuations of the internal core voltage can be prevented.

Consistent with the first and the second embodiments of this invention, the internal voltage supplying device directly receives the internal core voltage, and generates the high voltage by sensing the decreasing level of the high voltage using the internal core voltage as a reference. That is, the high voltage generated by the internal supplying device consistent with the exemplary embodiments of this invention can maintain a level higher than the internal core voltage by the level of the threshold voltage at all times. Thus, the voltage loss caused by the threshold voltage cell transistor does not occur when transferring the data of the internal core voltage level, resulting in the improved device reliability.

The present application contains subject matter related to the Korean patent application Nos. KR 2005-0090961 and KR 2006-0049119, filed in the Korean Patent Office on Sep. 29, 2005 and May 31, 2006, respectively, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. An internal voltage supplying device, comprising:
   a reference voltage generating unit for generating a reference voltage having a predetermined voltage ratio with respect to a core voltage by dividing a level of the core voltage in response to a selection signal;
   an adjusting unit for decoding test mode signals or signals corresponding to blowing states of fuses to generate the selection signal for adjusting the voltage ratio; and
   a voltage generating unit for supplying a high voltage having a level higher than the level of the core voltage by a threshold voltage or higher and for maintaining the level of the high voltage corresponding to the reference voltage.

2. The internal voltage supplying device of claim 1, wherein the reference voltage generating unit comprises:
   a dividing unit to divide the core voltage into various levels and to output a plurality of dividing voltages; and
   a selection unit to select one of the dividing voltages in response to the selection signal, and to output the selected dividing voltage as the reference voltage.

3. The internal voltage supplying device of claim 2, wherein the dividing comprises a plurality of resistors coupled in series to output voltages caught on each connect node of the resistors as the dividing voltages.

4. The internal voltage supplying device of claim 3, the dividing unit further comprises a plurality of capacitors coupled to connect the nodes of the resistors, respectively.

5. The internal voltage supplying device of claim 1, wherein the adjusting unit comprises a decoder to decode the test mode signals and output the selection signal based on a decoded result.

6. The internal voltage supplying device of claim 1, wherein the adjusting unit comprises:
   a plurality of fuse option units, each fuse option unit comprising the fuse; and
   a decoder to decode the signals corresponding to blowing states of the fuses of the fuse option units and to output the selection signal based on a decoded result.

7. The internal voltage supplying device of claim 1, wherein the adjusting unit comprises:
   a setup unit to generate a plurality of setup signals based on the signals corresponding to the blowing states of the fuses and the test mode signals; and
   a decoder to decode the setup signals to output the selection signal.

8. The internal voltage supplying device of claim 7, wherein the setup unit comprises:
   a plurality of NOR gates each having an output signal of a respective fuse option unit and a respective test mode signal as inputs; and
   a plurality of inverters to invert output signals of the NOR gates to output the setup signals.

9. The internal voltage supplying device of claim 1, wherein the voltage generating unit comprises:
   a level sensing unit to sense the level of he high voltage with respect to the reference voltage to output a level signal;
   an oscillation signal generating unit o generate an oscillation signal in response to the level signal; and
   a pumping unit pumping to charge during an activation interval of the oscillation signal to output the high voltage.

10. The internal voltage supplying device of claim 9, wherein the level sensing unit comprises:
    a feedback unit to divide the high voltage to output a feedback voltage;
    a comparator to compare the feedback voltage with the reference voltage; and
    a buffer to buffer an output signal of the comparator to output the level signal.

11. The internal voltage supplying device of claim 10, wherein the comparator comprises a differential amplifier having the feedback voltage and the reference voltage as differential inputs.

12. The internal voltage supplying device of claim 11, wherein the feedback unit comprises first and second resistors coupled in series and is to output a voltage caught on a connect node of the first second resistors as the feedback voltage.

13. The internal voltage supplying device of claim 12, wherein the resistors comprise a passive device.

14. The internal voltage supplying device of claim 12, wherein the resistors comprise a transistor.

15. A method for operating an internal voltage supplying device, comprising:
    generating a reference voltage having a first predetermined voltage ratio with respect to a core voltage by dividing a level of the core voltage in response to a selection signal;
    generating a feedback voltage having a second predetermined voltage ratio with respect to a high voltage, wherein the first predetermined voltage ratios are controlled by decoding test mode signals or signals corresponding to blowing states of fuses; and
    generating the high voltage having a level raised higher than a level of the core voltage by the level of a threshold voltage or higher, while maintaining a level of the feedback voltage corresponding to the reference voltage, wherein the core voltage is used for storing data of a logic level in a cell, and the is high voltage is used for activating the cell to allow the data to be transferred.

16. The method of claim 15, wherein the maintaining of the level of the feedback voltage to correspond to the reference voltage comprises:
    comparing the level of the feedback voltage with the reference voltage; and
    performing a charge pumping to raise the level of the feedback voltage when the feedback voltage is lower than the reference voltage.

* * * * *